United States Patent [19]

Kato et al.

[11] Patent Number: 4,806,787

[45] Date of Patent: Feb. 21, 1989

[54] SCHMITT CIRCUIT FOR SEMICONDUCTOR INTEGRATED CIRCUIT

[75] Inventors: Takahiro Kato, Yokohama; Katsuji Hirochi, Kawasaki; Takanori Sugihara, Inagi, all of Japan

[73] Assignee: Fujitsu Limited, Kawasaki, Japan

[21] Appl. No.: 36,998

[22] Filed: Apr. 10, 1987

[30] Foreign Application Priority Data

Apr. 30, 1986 [JP] Japan ................................ 61-100115

[51] Int. Cl.$^4$ ..................... H03K 3/288; H03K 3/295; H03K 3/017; H01L 27/02

[52] U.S. Cl. .................................... 307/290; 307/303; 357/51

[58] Field of Search ..................... 307/290, 255, 303.1, 307/360, 362, 363, 563, 303; 357/51, 45; 323/354

[56] References Cited

U.S. PATENT DOCUMENTS

| | | | |
|---|---|---|---|
| 3,471,718 | 10/1969 | Weisz | 307/290 |
| 4,109,198 | 8/1978 | Ueno | 307/351 |
| 4,549,131 | 10/1985 | Kusazaki | 357/51 |
| 4,562,451 | 12/1985 | Fuse | 357/51 |

FOREIGN PATENT DOCUMENTS

| | | | |
|---|---|---|---|
| 47806 | 6/1978 | Japan | 307/290 |
| 0075848 | 7/1978 | Japan | 307/290 |

Primary Examiner—Stanley D. Miller
Assistant Examiner—Nancy Thai
Attorney, Agent, or Firm—Staas & Halsey

[57] ABSTRACT

A Schmitt circuit for a semiconductor integrated circuit has resistances of predetermined resistors of the Schmitt circuit respectively selected from a plurality of resistances so as to obtain desired threshold voltages by selecting electrodes to which wiring is connected when producing the semiconductor integrated circuit according to the master slice method. Thus the Schmitt circuits have different threshold voltages depending on the selection of the electrodes to which the wiring is connected.

7 Claims, 5 Drawing Sheets

SCHMITT CIRCUIT FOR SEMICONDUCTOR INTEGRATED CIRCUIT

BACKGROUND OF THE INVENTION

The present invention generally relates to Schmitt circuits for semiconductor integrated circuits. More particularly, the present invention is directed to a Schmitt circuit for a semiconductor integrated circuit in which threshold voltages of the Schmitt circuit are set arbitrarily when producing the semiconductor integrated circuit by the master slice method.

A Schmitt circuit is used for various purposes such as for comparing amplitudes of signals and for converting a sinusoidal wave into a rectangular wave. An example of a Schmitt circuit is a bistable multivibrator comprising first and second Schottky clamped transistors and resistors. A collector of the first transistor is coupled to a base of the second transistor and an emitter of the first transistor is coupled to an emitter of the second transistor. An input voltage to the Schmitt circuit is applied to a base of the first transistor, and an output signal of the Schmitt circuit is obtained from a collector of the second transistor.

Usually, a third PNP transistor is provided as an input buffer, and the input voltage to the Schmitt circuit is supplied to the base of the first transistor via the third transistor. A first resistor is coupled between a power source terminal supplied with a power source voltage and a connection between an emitter of the third transistor and the base of the first transistor, and a collector of the third transistor is grounded. A second resistor is coupled between the power source terminal and the connection between the collector of the first transistor and the base of the second transistor. A third resistor is coupled between the power source terminal and the collector of the second transistor, and a fourth resistor is coupled between ground and the connection between the emitters of the first and second transistors. A pair of threshold voltages of the Schmitt circuit can be varied by varying the resistances of the first through fourth resistors.

Conventionally, when providing a Schmitt circuit on a semiconductor integrated circuit such as a large scale integrated circuit (LSI), appropriate resistances for the first through fourth resistors are calculated beforehand when designing the Schmitt circuit having a desired pair of threshold voltages. For this reason, the resistances for the first through fourth resistors must be calculated for each different pair of threshold voltages. Hence, there are problems in that the pair of threshold voltages of one Schmitt circuit for the semiconductor integrated circuit are fixed, and Schmitt circuits having different pairs of threshold voltages must be designed independently according to the needs. As a result, the production cost of the conventional Schmitt circuit for a semiconductor integrated circuit is high.

SUMMARY OF THE INVENTION

Accordingly, it is a general object of the present invention to provide a novel and useful Schmitt circuit for semiconductor integrated circuits in which the problems described heretofore are eliminated.

Another and more specific object of the present invention is to provide a Schmitt circuit for semiconductor integrated circuits in which resistances of predetermined resistors of the Schmitt circuit are selected from a plurality of resistances so as to obtain a desired pair of threshold voltages. This is achieved by selecting electrodes to which the wiring is connected when producing the semiconductor integrated circuit according to the master slice method. According to the Schmitt circuit of the present invention, Schmitt circuits having different pairs of threshold voltages can be produced depending on the selection of the electrodes to which the wiring to connected. For this reason, the production cost of the Schmitt circuit for the semiconductor integrated circuit can be reduced.

Other objects and further features of the present invention will be apparent from the following detailed description when read in conjunction with the accompanying drawings.

DESCRIPTION OF THE PREFERRED EMBODIMENTS

Figure 1:
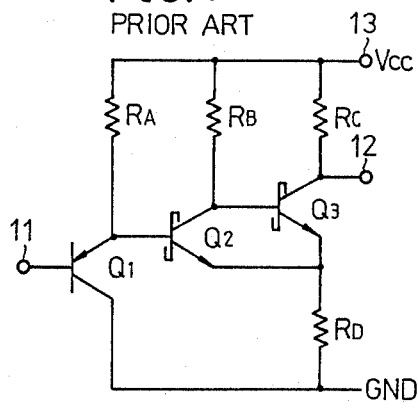
FIG. 1 is a circuit diagram of a prior art Schmitt circuit.

FIG. 1 is a known Schmitt circuit. The Schmitt circuit includes a PNP transistor $Q_1$ which is used as an input buffer, Schottky clamped transistors $Q_2$ and $Q_3$, and resistors $R_A$, $R_B$, $R_C$ and $R_D$. An input voltage Vi to the Schmitt circuit is applied to a base of the transistor $Q_1$ via an input terminal 11. An emitter of the transistor $Q_1$ is coupled to a base of the transistor $Q_2$ and to one terminal of the resistor $R_A$, and a collector of the transistor $Q_1$ is grounded. A collector of the transistor $Q_2$ is coupled to a base of the transistor $Q_3$ and to one terminal of the resistor $R_B$, and an emitter of the transistor $Q_2$ is coupled to an emitter of the transistor $Q_3$ and to one terminal of the resistor $R_D$. A collector of the transistor $Q_3$ is coupled to a output terminal 12 and to one terminal of the resistor $R_C$. The resistors $R_A$, $R_B$ and $R_C$ have the other terminals thereof coupled to a power source terminal 13 supplied with a power source voltage Vcc, and the other terminal of the resistor $R_D$ is grounded.

Figure 2:
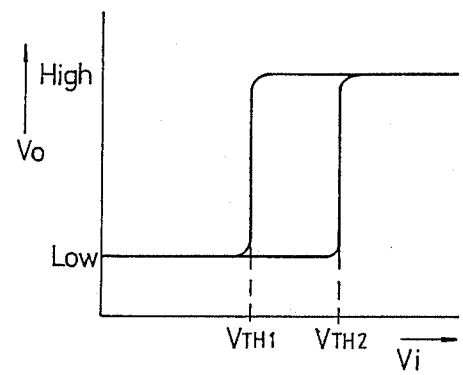
FIG. 2 is a hysteresis curve of an input voltage versus output voltage characteristic of the Schmitt circuit shown in FIG. 1.

FIG. 2 is a hysteresis curve of the input voltage Vi versus output voltage Vo characteristic of the Schmitt circuit shown in FIG. 1. When the input voltage Vi is small, the transistor $Q_1$ is ON, the transistor $Q_2$ is OFF and the transistor $Q_3$ is ON, and the output voltage Vo from the output terminal 12 has a low level. As the input voltage Vi rises over a threshold voltage $V_{TH2}$, the transistor $Q_2$ is turned ON, and the transistor $Q_3$ is turned OFF, and the level of the output voltage Vo becomes high. Thereafter, as the input voltage Vi falls under a threshold voltage $V_{TH1}$, where $V_{TH1} < V_{TH2}$, the transistor $Q_2$ is turned OFF, the transistor $Q_3$ is turned ON, and the level of the output voltage Vo becomes low. As is well known, the threshold voltages $V_{TH1}$ and $V_{TH2}$ can be varied arbitrarily by varying the resistances of the resistors $R_A$, $R_B$, $R_C$ and $R_D$.

Conventionally, when providing a Schmitt circuit on a semiconductor integrated circuit such as a large scale integrated circuit (LSI), appropriate resistances for the resistors $R_A$, $R_B$, $R_C$ and $R_D$ are calculated beforehand when designing the Schmitt circuit having a desired pair of threshold voltages $V_{TH1}$ and $V_{TH2}$. For this reason, the resistances for the resistors $R_A$, $R_B$, $R_C$ and $R_D$ must be calculated for each different pair of threshold voltages. Hence, there are problems in that the pair of threshold voltages of one Schmitt circuit for the semiconductor integrated circuit are fixed, and Schmitt circuits having different pairs of threshold voltages must be designed independently according to need. As a result, the production cost of a conventional Schmitt circuit for a semiconductor integrated circuit is high.

The present invention eliminates the problems of the conventional Schmitt circuit for semiconductor integrated circuit by making it possible to set the pair of threshold voltages of the Schmitt circuit by selecting the resistances of predetermined resistors when producing the semiconductor integrated circuit according to the master slice method.

Figure 3A:
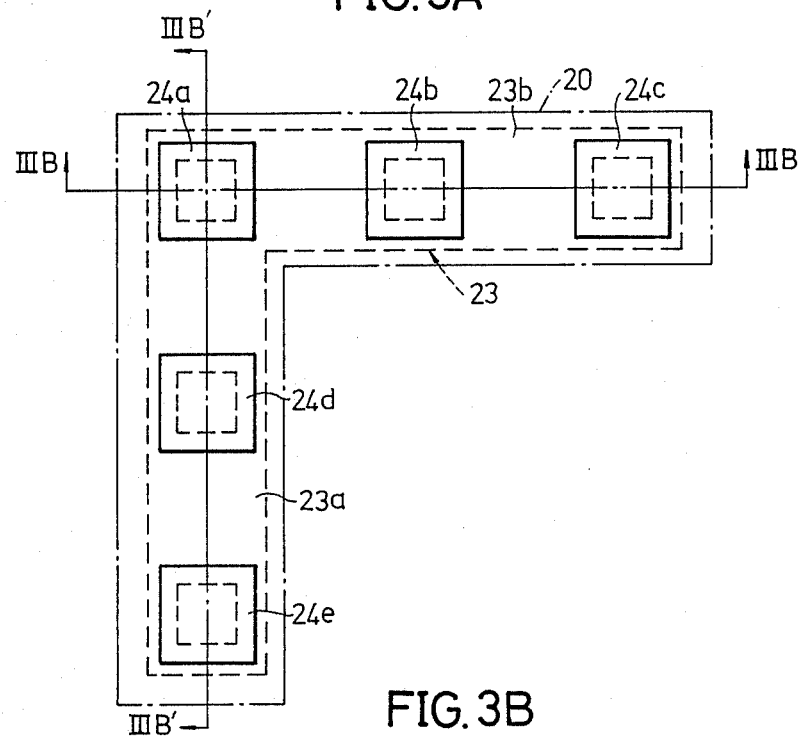
FIGS. 3A and 3B are a plan view and a cross sectional view, respectively, of an embodiment of the Schmitt circuit for a semiconductor integrated circuit according to the present invention.
Figure 3B:
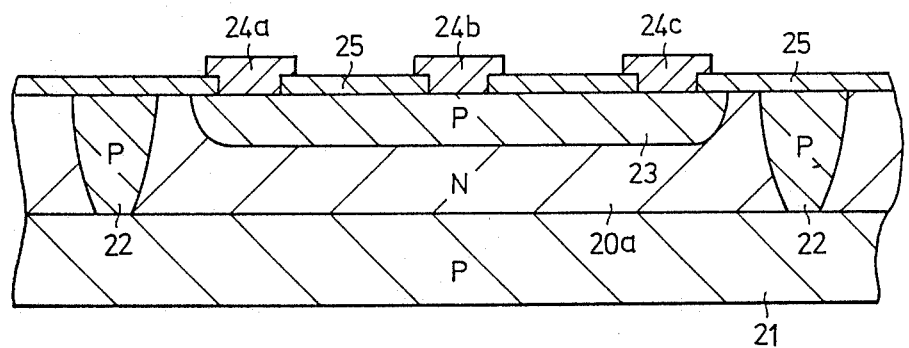

FIGS. 3A and 3B are a plan view and a cross sectional view, respectively, of an embodiment of the Schmitt circuit for semiconductor integrated circuit according to the present invention. The circuit construction of the Schmitt circuit itself is known, and in the present embodiment, it will be assumed for convenience sake that the Schmitt circuit has the circuit construction shown in FIG. 1.

In FIG. 3A, a device forming region 20 is indicated by a one-dot chain line. As shown in FIG. 3B which is a cross section along a line IIIB—IIIB in FIG. 3A, the device forming region 20 is formed by growing epitaxially an N-type layer 20a on a P-type substrate 21. The device forming region 20 is isolated from other device forming regions by a P-type device isolation region 22. A P-type region 23 is formed in the N-type layer 20a, and this P-type region 23 has an approximate L-shape in the plan view as indicated by a phantom line in FIG. 3A. An arm portion 23a of the P-type region 23 forms the resistor $R_B$ shown in FIG. 1, and an arm portion 23b of the P-type region 23 forms the resistor $R_C$ shown in FIG. 1.

FIG. 3B shows the cross section of the arm portion 23b. The cross section of the arm portion 23a along a line IIIB'—IIIB' in FIG. 3A is similar to the cross section of the arm portion 23b shown in FIG. 3B, and the illustration and description thereof will be omitted. Electrodes 24a, 24b and 24c are provided on the arm portion 23b, and an insulator layer 25 covers remaining surface portions of the arm portion 23b. Similarly, electrodes 24a, 24d and 24e are provided on the arm portion 23a, and the insulator layer 25 covers remaining surface portions of the arm portion 23a. The electrode 24a is used in common between the two arm portions 23a and 23b.

P-type silicon, for example is used for the P-type substrate 21, the P-type device isolation region 22 and the P-type region 23. N-type silicon is used for the N-type layer 20a, aluminum is used for the electrodes 24a through 24e, and silicon dioxide is used for the insulator layer 25.

The electrode 24a is coupled to the power source terminal 13 shown in FIG. 1. Either the electrode 24b or 24c is coupled to the collector of the transistor $Q_3$. The resistance of the resistor $R_C$ is small when the electrode 24b is selected and coupled to the collector of the transistor $Q_3$, and is large when the electrode 24c is coupled to the collector of the transistor $Q_3$. This is due to the distance between the two selected electrodes. Similarly, either the electrode 24d or 24e is coupled to the collector of the transistor $Q_2$. The resistance of the resistor $R_B$ is small when the electrode 24d is selected and coupled to the collector of the transistor $Q_2$, and is large when the electrode 24e is selected and coupled to the collector of the transistor $Q_2$.

When producing the semiconductor integrated circuit according to the master slice method, the wiring is formed after basic cells are formed on the substrate 21. Hence, the coupling of the electrode 24b or 24c to the collector of the transistor $Q_3$ and the coupling of the electrode 24d or 24e to the collector of the transistor $Q_2$ can be carried out selectively when the wiring is formed. In other words, the threshold voltages $V_{TH1}$ and $V_{TH2}$ of the Schmitt circuit can be set to desired voltages by selecting the electrodes and accordingly selecting the resistances of the resistors $R_B$ and $R_C$ when forming the wiring.

It is possible to provide electrodes on a P-type region forming the resistors $R_A$ and $R_D$ in a manner similarly to forming the electrodes 24a through 24e of the resistors $R_B$ and $R_C$, and set the resistances of the resistors $R_A$ and $R_D$ by selecting predetermined electrodes. The threshold voltages $V_{TH1}$ and $V_{TH2}$ of the Schmitt circuit can also be varied by varying the resistances of the resistors $R_A$ and $R_D$, since the threshold voltages $V_{TH1}$ and $V_{TH2}$ are dependent on the resistances of the resistors $R_A$, $R_B$, $R_C$ and $R_D$ as described before.

However, because the resistor $R_A$ is coupled between the power source terminal 13 and the emitter of the transistor $Q_1$, the input characteristic at the input terminal 11 changes when the resistance of the resistor $R_A$ is varied. The input characteristic is for example an input current flowing from the power source terminal 13 to the resistor $R_A$, the emitter-base of the transistor $Q_1$ and the input terminal 11 when the input level is low, which should be absorbed by an external circuit (not shown) connected to the input terminal 11. For this reason, it is preferable that the resistance of the resistor $R_A$ is not varied, that is, kept constant.

In addition, when the resistance of the resistor $R_D$ is varied, it is difficult to set ranges in which the threshold voltages $V_{TH1}$ and $V_{TH2}$ of the Schmitt circuit vary because the first threshold voltage $V_{TH1}$ is determined by the resistances of the resistors $R_A$, $R_B$ and $R_D$ and the second threshold voltage $V_{TH2}$ is determined by the resistances of the resistors $R_B$, $R_C$ and $R_D$. Thus, it is preferable that the resistance of the resistor $R_D$ is also not varied, that is, it is kept constant.

Therefore, in the present embodiment, the resistances of the resistors $R_A$ and $R_D$ are kept constant, and only the resistances of the resisators $R_B$ and $R_C$ are varied in order to vary the threshold voltages $V_{TH1}$ and $V_{TH2}$ of the Schmitt circuit.

When it is assumed that the input voltage Vi is large and the transistor $Q_1$ is OFF in a first state, a current flowing through the resistor $R_A$ is applied to the base of the transistor $Q_2$. Hence, the transistor $Q_2$ is turned ON, a current flowing through the resistor $R_B$ flows through the transistor $Q_2$, and the transistor $Q_3$ is turned OFF. It will be assumed that the level of the output voltage Vo is high in the first state. In this first state, the Schmitt circuit shown in FIG. 1 can be illustrated by an equivalent circuit shown in FIG. 4. In this initial state, resistors $R_1$, $R_2$ and $R_3$ respectively correspond to the resistors $R_A$, $R_B$ and $R_D$, and a Schottky clamped transistor Tr corresponds to the transistor $Q_2$.

Figure 4:
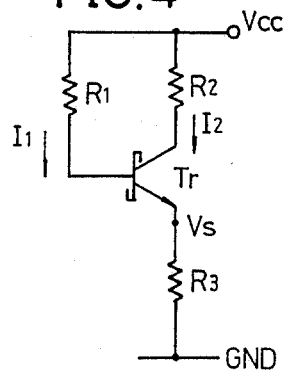
FIG. 4 is a circuit diagram of resistors in the Schmitt circuit.

The following set of equations (1) stand in FIG. 4, where $R_1$ through $R_3$ respectively denote resistances of the resistors $R_1$ through $R_3$, $I_1$ and $I_2$ respectively denote currents flowing through the resistors $R_1$ and $R_2$, $V_{BE}$ denotes a base-emitter voltage of the transistor Tr, $V_F$ denotes a voltage across a Schottky barrier diode (not shown) of the transistor Tr, and Vs denotes a voltage at the connection between the resistor $R_3$ and the emitter of the transistor Tr.

$$R_1 \cdot I_1 + V_{BE} + R_3 \cdot (I_1 + I_2) = Vcc \quad (1)$$
$$R_2 \cdot I_2 - V_F + V_{BE} + R_3 \cdot (I_1 + I_2) = Vcc$$
$$Vs = R_3 \cdot (I_1 + I_2)$$

The above set of equations (1) can be solved for Vs as the following equation (2).

$$Vs = R_3 \cdot (R_1 + R_2)(Vcc - V_{BE} + (R_1 + R_3) \cdot V_F/R_1)/(R_1 \cdot R_2 + R_1 \cdot R_3 + R_2 \cdot R_3) - R_3 \cdot V_F/R_1 \quad (2)$$

As the large input voltage Vi falls to the threshold voltage $V_{TH1}$ (where $V_{TH1} = Vs + V_{BE}(Q_2) - V_{BE}(Q_1) \simeq Vs$, where Vs is determined by $R_A$, $R_B$ and $R_D$), the transistor $Q_1$ is turned ON and the current flowing through the resistor $R_A$ flows through the transistor $Q_1$. Hence, the transistor $Q_2$ is turned OFF, and the current flowing through the resistor $R_B$ is applied to the base of the transistor $Q_3$ thereby turning ON the transistor $Q_3$. As a result, the output voltage Vo falls from the high level to a low level. It can thus be seen that the threshold voltage $V_{TH1}$ ($\simeq Vs$) of the Schmitt circuit is dependent on the resistances of the resistors $R_A$, $R_B$ and $R_D$.

When the resistances of the resistors $R_A$ and $R_D$ are kept constant for the reasons described before, only $R_3 \cdot (R_1 + R_2)/(R_1 \cdot R_2 + R_1 \cdot R_3 + R_2 \cdot R_3)$ in the first term on the right hand side of the equation (2) contains a variable. The term $R_3 \cdot (R_1 + R_2)/(R_1 \cdot R_2 + R_1 \cdot R_3 + R_2 \cdot R_3)$ can be rewritten as follows.

$$\begin{aligned} & R_3 \cdot (R_1 + R_2)/(R_1 \cdot R_2 + R_1 \cdot R_3 + R_2 \cdot R_3) \quad (3) \\ = & R_3 \cdot (R_1 + R_2)/(R_1 \cdot R_2 + R_3 \cdot (R_1 + R_2)) \\ = & 1/[(R_1 \cdot R_2 + R_3 \cdot (R_1 + R_2))/(R_3 \cdot (R_1 + R_2))] \\ = & 1/[(R_1 \cdot R_2/(R_3 \cdot (R_1 + R_2)) + 1] \\ = & 1/[R_1 \cdot R_2/(R_3 \cdot R_1 + R_3 \cdot R_2) + 1] \\ = & 1/[R_1/(R_3 \cdot R_1/R_2 + R_3) + 1] \end{aligned}$$

When the resistance of the resistor $R_B$ ($R_2$ in this case) is increased, the term $1/[R_1/(R_3 \cdot R_1/R_2 + R_3) + 1]$ decreases thereby decreasing Vs. In other words, the threshold voltage $V_{TH1}$ ($\simeq Vs$) decreases as the resistance of $R_B$ is increased.

On the other hand, when it is assumed that the input voltage Vi is small and the transistor $Q_1$ is ON in a second state, the current flowing through the resistor $R_A$ flows through the transistor $Q_1$. Hence, the transistor $Q_2$ is turned OFF, the current flowing through the resistor $R_B$ is applied to the base of the transistor $Q_3$, and the transistor $Q_3$ is turned ON. It will be assumed that the level of the output voltage Vo is low in the second state. In the second state, the Schmitt circuit shown in FIG. 1 can also be illustrated by the equivalent circuit shown in FIG. 4. But in the second state, the resistors $R_1$, $R_2$ and $R_3$ respectively correspond to the resistors $R_B$, $R_C$ and $R_D$, and the transistor Tr corresponds to the transistor $Q_3$.

As the small input voltage Vi rises to the threshold voltage $V_{TH2}$ ($= Vs + V_{BE}(Q_2) - V_{BE}(Q_1) \simeq Vs$, where Vs is determined by $R_B$, $R_C$ and $R_D$), the transistor $Q_1$ is turned OFF and the current flowing through the resistor $R_A$ is applied to the base of the transistor $Q_2$. Hence, the transistor $Q_2$ is turned ON, and the current flowing through the resistor $R_B$ flows through the transistor $Q_2$ thereby turning OFF the transistor $Q_3$. As a result, the output voltage Vo rises from the low level to a high level. It can thus be seen that the threshold voltage $V_{TH2}$ ($\simeq Vs$) of the Schmitt circuit is dependent on the resistances of the resistors $R_B$, $R_C$ and $R_D$.

When the resistance of the resistor $R_D$ is kept constant for the reason described before and the resistance of the resistor $R_B$ is set to obtain the desired threshold voltage $V_{TH1}$ only $R_3 \cdot (R_1 + R_2)/(R_1 \cdot R_2 + R_1 \cdot R_3 + R_2 \cdot R_3)$ in the first term on the right hand side of the equation (2) contains a variable, as in the case described before. Hence, when the resistance of the resistor $R_C$ increases, the voltage Vs decreases and the threshold voltage $V_{TH2}$ decreases.

The difficulty in setting the ranges in which the threshold voltages $V_{TH1}$ and $V_{TH2}$ of the Schmitt circuit vary when the resistance of the resistor $R_D$ is made variable may also be understood from the equation (2) since $R_3$ appears in each term.

Figure 5:
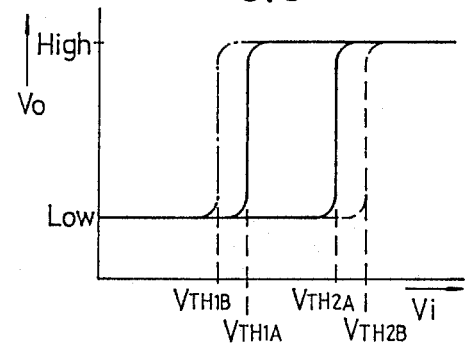
FIG. 5 is a graph of hysteresis curves showing input voltage versus output voltage characteristics of the Schmitt circuit for the semiconductor integrated circuit according to the present invention.

FIG. 5 is a graph of hysteresis curves of the Schmitt circuit for the combination of the resistances of the resistors $R_B$ and $R_C$. Threshold voltages $V_{TH1A}$ and $V_{TH2A}$ are obtained when the resistances of the resistors $R_B$ and $R_C$ respectively are small and large by selecting the electrodes 24d and 24c. Threshold voltages $V_{TH1B}$ and $V_{TH2A}$ are obtained when the resistances of the resistors $R_B$ and $R_C$ respectively are small by selecting the electrodes 24d and 24b. Threshold voltages $V_{TH1A}$ and $V_{TH2B}$ are obtained when the resistances of the resistors $R_B$ and $R_C$ respectively are large and small by selecting the electrodes 24e and 24b.

Figure 6:
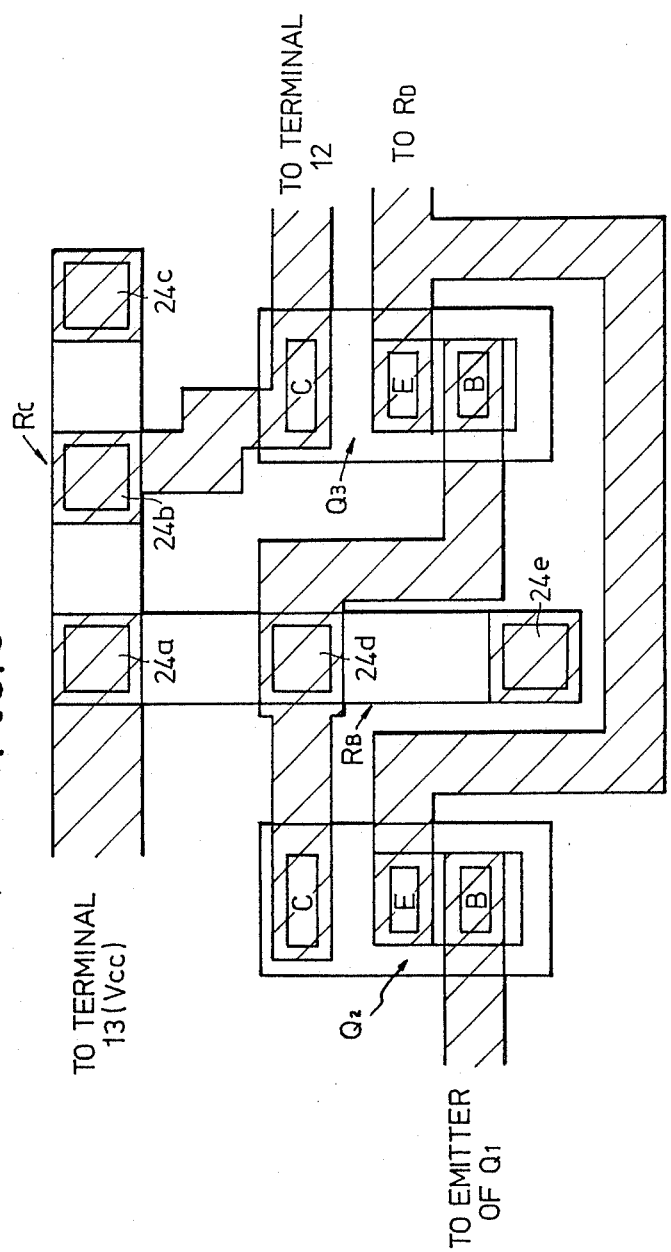
FIGS. 6 and 7 are plan views, respectively, of different examples of the wiring in the embodiment shown in FIGS. 3A and 3B.

FIG. 6 is a plan view of an essential part of the wiring formed on the embodiment shown in FIGS. 3A and 3B. In FIG. 6, those parts which are the same as those corresponding parts in FIGS. 3A and 3B are designated by the same reference numerals, and the wiring which is made of aluminum, for example, is shown by hatchings. Further, C, E and B respectively denote the collector, emitter and base of the transistors. FIG. 6 shows the case where the resistances of both the resistors $R_B$ and $R_C$ are selected to be small values by selecting the electrodes 24d and 24b, and the threshold voltages $V_{TH1B}$ and $V_{TH2A}$ are obtained.

Figure 7:
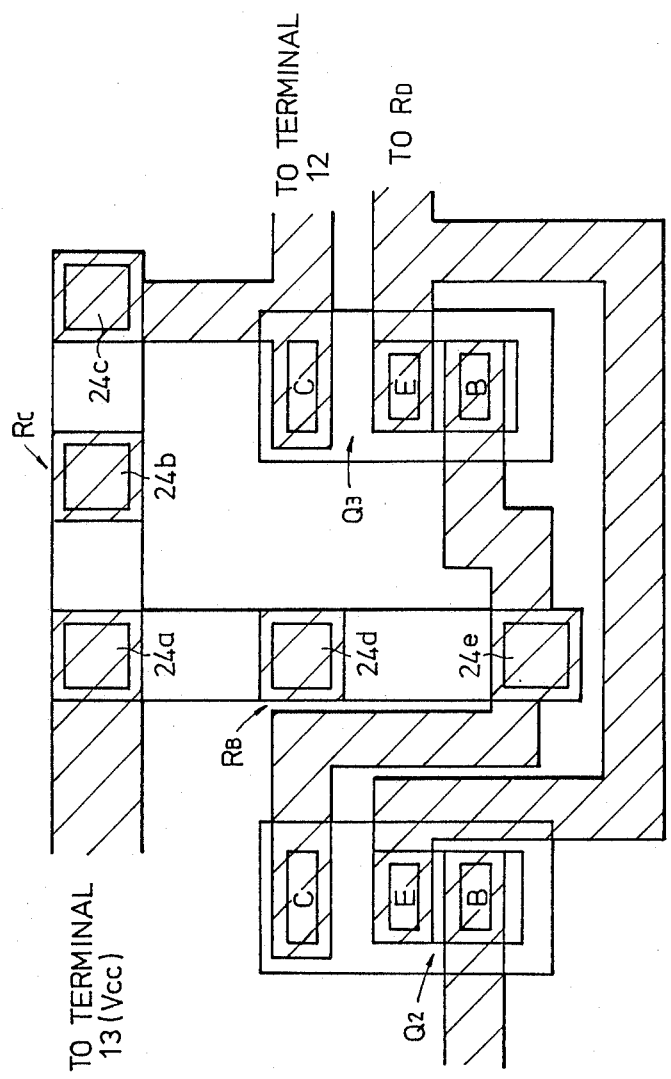

FIG. 7 is a plan view of another essential part of the wiring formed on the embodiment shown in FIGS. 3A and 3B. In FIG. 7, those parts which are the same as those corresponding parts in FIG. 6 are designated by the same reference numerals, and description thereof will be omitted. FIG. 7 shows the case where the resistances of both the resistors $R_B$ and $R_C$ are selected to be large values by selecting the electrodes 24e and 24c.

Figure 8:
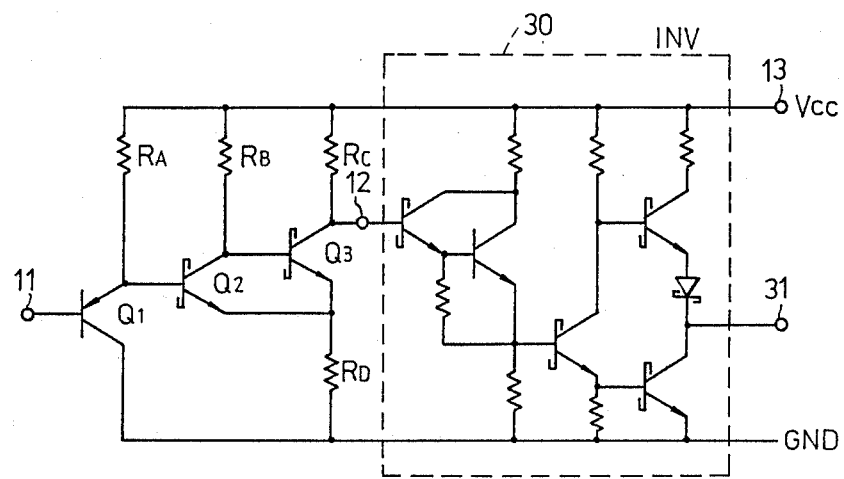
FIG. 8 is a circuit diagram of a modification of the embodiment of the present invention.

FIG. 8 is a modification of the embodiment described heretofore. In FIG. 8, those parts which are the same as those corresponding parts in FIG. 1 are designated by the same reference numerals, and description thereof will be omitted. In this modification, an inverter 30 is coupled to the output terminal 12, and an inverted output voltage is obtained via a terminal 31.

In the embodiment described heretofore, the resistor $R_B$, for example, comprises three electrodes 24a, 24d and 24e on the P-type region 23 which is used as a resistor layer. However, the number of electrodes on the resistor layer is not limited to three.

Moreover, in FIGS. 3A and 3B, a plurality of resistor regions are formed for each of the resistors $R_B$ and $R_C$ by providing a plurality of electrodes along the longitudinal direction of the resistor layer. However, it is also possible to provide a plurality of independent resistor layers and obtain the desired resistance by selectively connecting the plurality of independent resistor layers in series or parallel.

Further, the present invention is not limited to these embodiments, but various variations and modifications may be made without departing from the scope of the present invention.

What is claimed is:

1. A Schmitt circuit for a semiconductor integrated circuit, comprising:
   an input terminal for receiving an input voltage;
   a power source terminal for receiving a power source voltage;
   a first transistor having a base coupled to said input terminal, having a collector coupled to ground, and having an emitter;
   a second transistor having a base coupled to said emitter of said first transistor, having a collector, and having an emitter;
   a third transistor having a base coupled to said collector of said second transistor, having a collector and having an emitter;
   an output terminal coupled to said collector of said third transistor;
   a first resistor coupled between said power source terminal and said emitter of said first transistor, said first resistor having a constant resistance;
   a second resistor comprising a plurality of first resistor regions which are selectively connected between said power source terminal and said collector of said second transistor for determining a resistance of said second resistor;
   a third resistor comprising a plurality of second resistor regions which are selectively connected between said power source terminal and said collector of said third transistor for determining a resistance of said third resistor;
   a fourth resistor coupled between ground and said emitters of said second and third transistors, said fourth resistor having a constant resistance; and
   wiring means for selectively connecting a selected first resistor region to the power source terminal and the collector of said second transistor, and for selectively connecting a selected second resistor region to the power source terminal and the collector of said third transistor, said first and second resistor regions being selected depending on threshold voltages to be obtained in said Schmitt circuit.

2. A Schmitt circuit for a semiconductor integrated circuit as claimed in claim 1, wherein said second resistor comprises a first resistor layer and a plurality of electrodes arranged along a longitudinal direction of said first resistor layer forming said plurality of first resistor regions, wherein two selected electrodes of said plurality of electrose on said first resistor layer being terminals of said second resistor, and wherein said third resistor comprises a second resistor layer and a plurality of electrodes arranged along a longitudinal direction of said second resistor layer forming said plurality of second resistor regions, two selected electrodes of said plurality of electrodes on said second resistor layer being terminals of said third resistor.

3. A Schmitt circuit for a semiconductor integrated circuit as claimed in claim 2, wherein a single resistor layer is used in common as said first and second resistor layers, and wherein a predetermined electrode on said single resistor layer is used in common as one of said two selected electrodes on said first resistor layer and one of said two selected electrodes on said second resistor layer, and respectively connected to the power source terminal by said wiring means.

4. A Schmitt circuit for a semiconductor integrated circuit as claimed in claim 3, wherein said single resistor layer has an approximate L-shape, and wherein said predetermined electrode is located at a position where two arm portions of said L-shape meet.

5. A Schmitt circuit for a semiconductor integrated circuit as claimed in claim 1, wherein said first transistor is a PNP transistor, and wherein said second and third transistors are Schottky clamped transistors.

6. A semiconductor integrated circuit device including a Schmitt circuit comprising:
   an input terminal for receiving an input voltage;
   a power source terminal for receiving a power source voltage;
   a plurality of first resistor regions formed in the semiconductor device;
   a plurality of second resistor regions formed in the semiconductor device;
   a first transistor having a base coupled to said input terminal, having a collector coupled to ground and having an emitter;
   a second transistor having a base coupled to said emitter of said first transistor, having a collector selectively connected to said plurality of first resistor regions, and having an emitter;
   a third transistor having a base coupled to said collector of said second transistor, having a collector selectively connected to said plurality of second resistor regions, and having an emitter;
   an output terminal coupled to said collector of said third transistor;
   wiring means, formed on the surface of the semiconductor device, for selectively connecting said first resistor regions to said power source terminal and said collector of said second transistor, and for selectively connecting said second resistor regions to said power source terminal and said collector of said third transistor;
   a first resistor coupled between said power source terminal and said emitter of said first transistor, said first resistor having a constant resistance;
   a second resistor connected between said power source terminal and said collector of said second transistor, said resistance of said second resistor being determined by said selective connection of said first resistor regions by said wiring means; and a third resistor connected between said power source terminal and said collector of said third transistor, said resistance of said third resistor being determined by said selective connection of said second resistor regions by said wiring means.

7. A Schmitt circuit as set forth in claim 1, wherein said wiring means selectively connects said first and second resistor regions in accordance with desired threshold voltages in said Schmitt circuit.

* * * * *

UNITED STATES PATENT AND TRADEMARK OFFICE
CERTIFICATE OF CORRECTION

PATENT NO. : 4,806,787
DATED : FEBRUARY 21, 1989
INVENTOR(S) : TAKAHIRO KATO ET AL.

It is certified that error appears in the above-identified patent and that said Letters Patent is hereby corrected as shown below:

Col. 4, line 32, "and set" should be --and to set--.

Col. 5, line 26, first line of equation 2, "(R-" should be --$R_1$.--;

line 27, second line of equation 2, delete "$_1$.".

*Col. 8, line 5, "electrose" should be --electrodes--.

Signed and Sealed this

Twenty-fifth Day of July, 1989

Attest:

DONALD J. QUIGG

Attesting Officer

Commissioner of Patents and Trademarks